United States Patent
Thompson et al.

(10) Patent No.: US 9,859,871 B2
(45) Date of Patent: Jan. 2, 2018

(54) RADIO TO TUNE MULTIPLE STATIONS SIMULTANEOUSLY AND SELECT PROGRAMMING SEGMENTS

(71) Applicants: David S. Thompson, Spokane, WA (US); David A. Divine, Spokane, WA (US)

(72) Inventors: David S. Thompson, Spokane, WA (US); David A. Divine, Spokane, WA (US)

(73) Assignee: Chip Engine, LLC, Spokane, WA (US)

( * ) Notice: Subject to any disclaimer, the term of this patent is extended or adjusted under 35 U.S.C. 154(b) by 238 days.

(21) Appl. No.: 14/663,434

(22) Filed: Mar. 19, 2015

(65) Prior Publication Data
US 2015/0271598 A1 Sep. 24, 2015

Related U.S. Application Data

(60) Provisional application No. 61/955,786, filed on Mar. 19, 2014.

(51) Int. Cl.
H03J 1/00 (2006.01)
(52) U.S. Cl.
CPC .......... *H03J 1/0058* (2013.01); *H03J 1/0083* (2013.01); *H03J 2200/20* (2013.01)
(58) Field of Classification Search
None
See application file for complete search history.

(56) References Cited

U.S. PATENT DOCUMENTS

| | | | | |
|---|---|---|---|---|
| 5,924,071 A * | 7/1999 | Morgan | ............... | G11B 27/034 369/126 |
| 6,591,245 B1 * | 7/2003 | Klug | ................ | G06F 17/30867 705/7.29 |
| 7,266,645 B2 * | 9/2007 | Garg | ................ | G06F 17/30575 707/E17.005 |
| 7,917,645 B2 * | 3/2011 | Ikezoye | .............. | G06F 17/3002 709/203 |
| 8,667,161 B2 * | 3/2014 | De Bonet | .............. | G06Q 30/02 709/219 |
| 8,892,225 B2 * | 11/2014 | Walsh | .................... | H04H 40/18 455/141 |

(Continued)

*Primary Examiner* — Charlie Y Peng

(57) ABSTRACT

Techniques describe tuning a plurality of radio stations, buffering digital audio data from each tuner, recognizing programming segments in the buffer, identifying content (e.g., song title and artist) of at least some segments, selecting from among the identified segments, and providing the selected segments to a listener. In an example, at least two signals are simultaneously tuned from at least two radio stations. Digital audio data and metadata obtained from the tuning may be buffered. The buffered data may be segmented into programming segments. Information may be obtained about the programming segments. For example, a song title and artist may be obtained for a programming segment comprising a song. In another example, a second programming segment may be identified as a commercial or may remain unidentified. The obtained information identifying programming segments may be analyzed to identify listener-preferred programming segments. Preferred programming segments may then be provided to the listener.

20 Claims, 9 Drawing Sheets

(56) References Cited

U.S. PATENT DOCUMENTS

| | | | | |
|---|---|---|---|---|
| 9,015,147 B2* | 4/2015 | Curtis | ............... | G06F 17/30749 |
| | | | | 707/721 |
| 2003/0093794 A1* | 5/2003 | Thomas | ............ | G06F 17/30017 |
| | | | | 725/46 |
| 2004/0226035 A1* | 11/2004 | Hauser, Jr. | ............ | G11B 27/034 |
| | | | | 725/9 |
| 2006/0075425 A1* | 4/2006 | Koch | ..................... | G06Q 30/02 |
| | | | | 725/32 |
| 2006/0089933 A1* | 4/2006 | Khandelwal | ....... | H04N 21/4263 |
| 2010/0010648 A1* | 1/2010 | Bull | .................... | G06F 3/04842 |
| | | | | 700/94 |
| 2013/0160038 A1* | 6/2013 | Slaney | ................ | H04N 21/233 |
| | | | | 725/14 |

* cited by examiner

RADIO TO TUNE MULTIPLE STATIONS SIMULTANEOUSLY AND SELECT PROGRAMMING SEGMENTS

RELATED APPLICATIONS

This patent application claims priority to U.S. provisional patent application Ser. No. 61/955,786, filed Mar. 19, 2014, and titled "Radio to Tune Multiple Stations Simultaneously and Select Programming", which is incorporated herein by reference.

BACKGROUND

One issue that plagues radio listeners is the frequent need to change stations. As songs and/or musical genre change, as radio personalities and/or programming change, or as commercial messages are played, listeners are inclined to change stations in search of more suitable programming.

In a home setting, a remote control (perhaps configured with preset stations) can assist a listener to change stations, particularly if the listener has convenient access to the remote control. In an automobile, pushbutton preset stations assist the listener to quickly change channels. Additionally, a "scan" feature may be used to automatically change stations until the listener hears a station that seems like a good balance between programming and continued searching.

However, in spite of the use of remote controls, preset stations and scanning devices, the listener is frequently tuned to a station that is not optimal.

Furthermore, radio is transient by nature. Listeners have no control over what song or program will come on next. Once a song is over, a listener has no way of listening to the song again.

BRIEF DESCRIPTION OF THE DRAWINGS

The detailed description is described with reference to the accompanying figures. In the figures, the left-most digit(s) of a reference number identifies the figure in which the reference number first appears. The same numbers are used throughout the drawings to reference like features and components. Moreover, the figures are intended to illustrate general concepts, and not to indicate required and/or necessary elements.

DETAILED DESCRIPTION

Overview

In a first example of the techniques: a radio receiver is configured to simultaneously tune a signal from each of a plurality of stations; buffer digital audio data from each of the plurality of tuned signals/stations; define or recognize programming segments within buffers (e.g., determine memory address ranges of different songs, commercials, etc.); recognize and/or determine an identify and/or the nature of at least some programming segments (e.g., obtain song title and artist of a programming segment or recognize a programming segment as a commercial); and select programming segments from buffer(s) associated with the plurality of stations for playback to a listener, to thereby provide the listener with a better radio experience.

In a second example of the techniques: a radio receiver is configured to simultaneously tune multiple stations; determine the nature of the programming on at least some of the stations (e.g., song vs. commercial); and to periodically select a preferred station for the listener.

In another example, techniques include recording and storing content. In some examples, the content may comprise audio content (e.g., songs, audio broadcasts of sporting events, audio books, talk radio programs, etc.).

While in the examples above, the receiver comprises a radio or audio receiver, in other examples the techniques described herein may additionally or alternatively be implemented using a video receiver or audio/video receiver. In that case, the content may comprise video or audio/video content (e.g., television programs, sporting events, movies, music videos, etc.). For instance, the video content may comprise live television content available via broadcast, cable, and/or satellite service. Any of the examples, embodiments, or techniques described for "radio" or "audio" content may be applied to video content as well. In such implementations, hardware and/or software components for receiving, processing, segmenting, annotating, transmitting and otherwise processing the content may be provided that are analogous to the hardware and software described for audio or radio embodiments described herein.

Example Systems and Techniques

Figure 1:
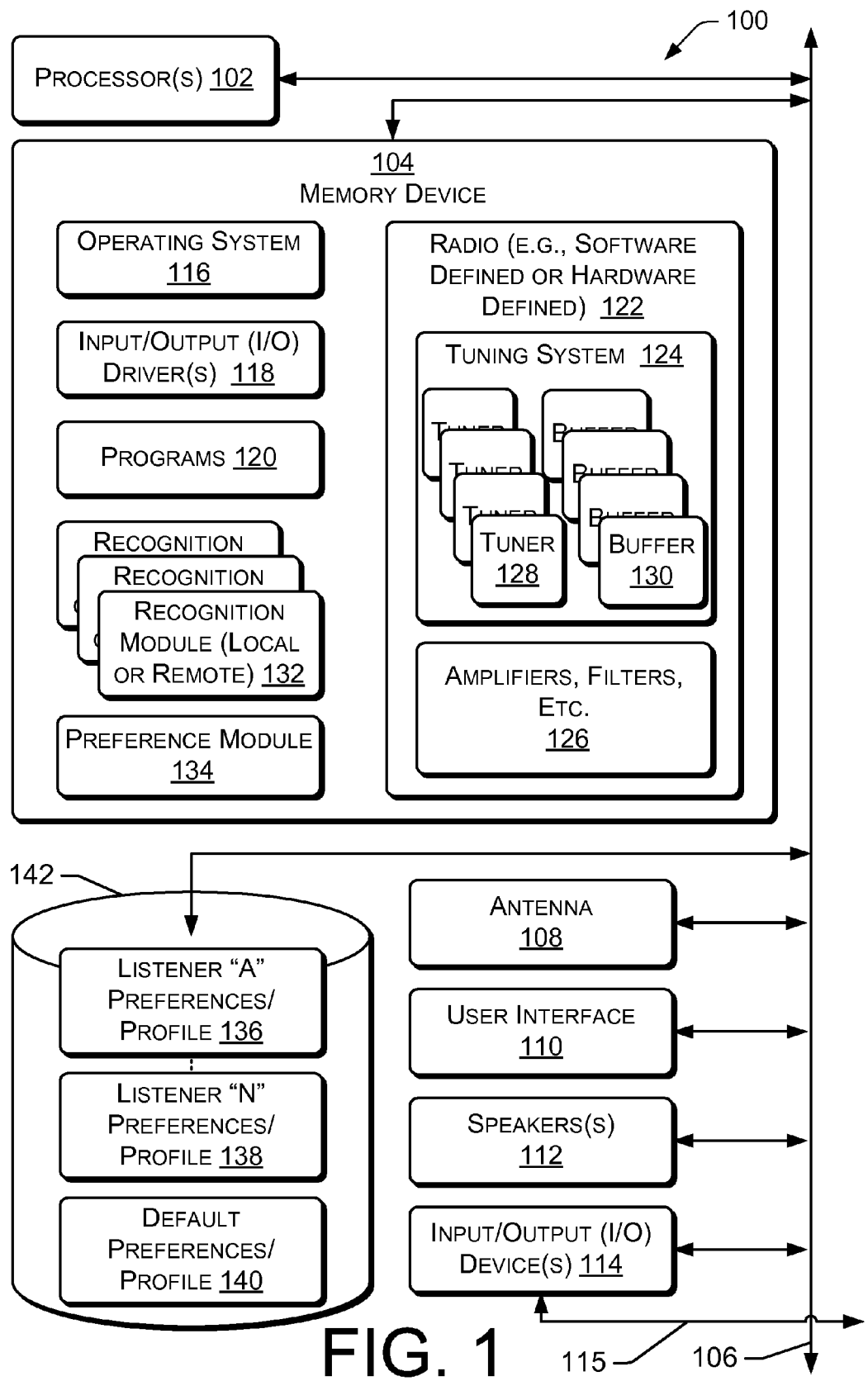
FIG. 1 is a block diagram showing a first example of a structure of a radio receiver configured to simultaneously tune multiple stations, buffer digital audio data from the tuned stations, recognize, categorize and/or distinguish programming segments within the buffer(s), and select programming segments for playback based on preferences of a listener, wherein programming information is obtained from multiple radio stations using a software-defined radio having multiple tuners.

FIG. 1 is a block diagram showing a first example of a structure of a system 100 configured to simultaneously tune a plurality of radio signals/stations, buffer digital audio programming segments and/or programming content, and to identify, select and provide listener-preferred programming In the example shown, a processor 102 may be a microprocessor, microcontroller or integrated circuit device. A memory device 104 may be accessible to the processor 102, typically by random access addressing. Connectors, wiring, printed circuit boards, and/or one or more busses 106 may be configured to connect various parts of the system 100.

An antenna 108 may be connected to the radio to provide signals from AM and/or FM radio stations, satellite radio, hybrid FM/satellite systems, or other radio sources (e.g., wi-fi). A user interface 110 may be configured to allow the user to turn on/off the system 100, to manually change radio stations, to adjust the speaker volume, to turn on/off any or all of the automatic features described herein, and/or to control other functionality. In one example, the user interface 110 may be configured to invite the user to purchase one or more songs played by, received by, or suggested by the system 100. The user interface 110 may be integrated with a cell phone application, or a listener's account with an on-line vendor, etc. One or more earphones and/or speakers 112 allow the system 100 to provide sound to one or more listeners. Input/output connectors and/or devices 114 may include connections, connectors, hardware devices, etc., such as earphone out, aux in (auxiliary input), USB (universal serial bus), blue tooth, CD, DVD, Blu Ray, and other input and output devices as known or later developed.

The antenna 108 may be integrated with, or combined with, a wire or wiring associated with the I/O device(s) 114. In one example, the I/O device 114 is configured to allow attachment of the system 100 to a USB port in a stereo or car radio using wiring 115. In such a configuration, the amplifier, speakers, etc., of the car radio would be utilized to "play" content provided by the system 100. The wire and/or wiring 115—from the system 100 to the USB port of the stereo or radio—may act as an antenna, or include an antenna, usable by the tuning system of the system 100. Thus, wiring 115 may provide USB connectivity and also antenna functionality.

The memory device 104 may contain an operating system 116, such as LINUX, Android, or alternative system. The operating system 116 may operate with one or more input/output drivers 118 and one or more software applications or programs 120. In one example, the I/O driver(s) 118 may control the I/O device(s) 114.

The system 100 may include a radio, which may be configured as a software-defined radio or a conventional hardware-defined radio. In the example of FIG. 1, the memory device 104 may contain elements of a software-defined radio 122. The software-defined radio may include a tuner system 124 and other components such as mixers, filters, and/or amplifiers 126 etc. that may be implemented in software.

The tuner system 124 may include a plurality of tuners 128 that may tune a plurality of radio stations (e.g., AM, FM, or satellite) simultaneously. Tuning is process comprising receiving a radio frequency signal (e.g., using an antenna) and producing a corresponding audio frequency (sound) signal and/or a digital audio data stream, buffer or file. Thus, while a listener is listening to content derived (in real time or by way of a recording) from one tuner, one or more other tuners are tuning one or more other radio stations. The output of each tuner may comprise digital audio data representing sound (e.g., music, talk, etc.) and/or digital metadata. The digital data representing sound may be in an MP3 format, or other format, as desired. The metadata may describe the sound, such as by indicating the name of a song or the artist performing the song. The one or more of plurality of tuners 128 may provide digital data output to one or more respective buffers 130. In one example, each buffer 130 may buffer a limited number of minutes (or, possibly, hours) of data before overwriting buffered data with new data. Thus, in one example, the last 10 to 60 minutes of data derived from each tuner 128 is stored in a respective buffer 130 with new data overwriting old data. Thus, at any given moment in time, each buffer 130 may include the audio data associated with one or more songs, one or more commercials and/or one or more periods of talk. Such buffered songs, commercials and/or periods of talk may be considered to be programming segments. Such buffered information may be present from a previous session when the system 100 is again turned on.

Recognition module(s) 132 may be configured to recognize content (e.g., digital audio data), which may be derived from one or more tuned radio signal(s). In operation, one or more recognition modules 132 may receive input in the form of digitized sound or metadata and provide output comprising an identity (e.g., a particular song) or category (e.g., music vs. commercial) of the input content.

Example input to the recognition module 132 may include data from one or more of a plurality of buffers 130, or data directly from one or more of the tuners 128 (e.g., if buffers are not utilized). Example output of the recognition module (s) 132 may include recognition of a particular song, recognition of a music genre, recognition of a commercial (either specifically or generally), recognition of disk-jockey/radio-personality chat, etc.

A plurality of recognition modules 132 and/or one or more recognition processes (sub-programs) may operate at any given time. Thus, a plurality of recognition modules may receive multiple tuned radio signals simultaneously or may receive multiple feeds from multiple buffers simultaneously. The recognition module 132 may apply one or more processes to each buffer 130, to segment the content in each buffer and to thereby distinguish and identify songs, commercials and other radio content. In one example, the recognition module 132 may determine one or more content changes or transitions in each buffer. Example content changes or transitions include a first song transitioning into a second song, a song transitioning into a commercial, a commercial transitioning into a song, etc.). In this example, the recognition module 132 may identify content between transitions of the buffered digital audio data (i.e., may recognize content of programming segments) in each buffer.

Figure 2:
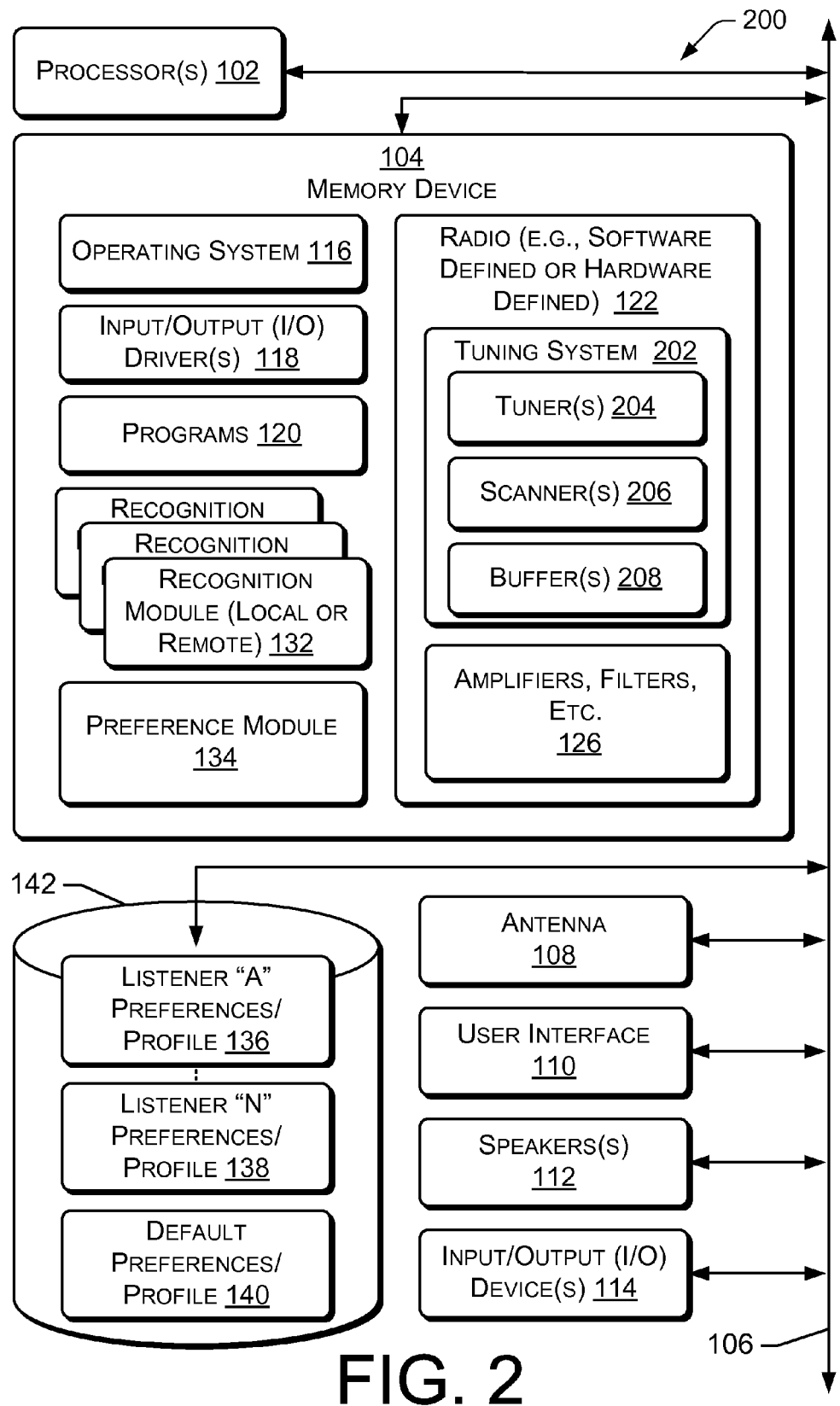
FIG. 2 is a block diagram showing a second example of a structure of a radio receiver, wherein programming information is obtained from multiple radio stations using a software-defined radio a tuner and a scanning tuner.

The recognition module 132 may recognize content by operation of a local algorithm, application and/or software or hardware function. Additionally or alternatively, the recognition module (e.g., as shown in FIG. 2) may recognize content by communication with, and/or utilization of, a remote content recognition service, such as Shazam. The recognition module 132 may be configured to distinguish songs, talk radio or other entertainment from commercials, different musical genres from each other, different songs from each other, talk radio from commercial messages, etc. Thus, the recognition module 132 may recognize content, either generally (music vs. talk), or more specifically (country music vs. rock music), or very specifically (a particular song, and perhaps how much of the song remains to be played). In a most basic functionality, recognition module 132 may recognize commercials and/or distinguish commercials from music and/or other programming The recognition module 132 may contact a remote content recognition service, such as Shazam, using the Internet. The system 100 may utilize an input output device 114, such as near field communication transceiver or blue tooth, to communicate with an application running on a cell phone, to reach the Internet and/or to reach the remote content recognition service. The remote content recognition service may utilize the user interface 110, or a user interface defined on the cell phone, to provide offers to purchase content. Examples of the content may include the songs recognized by the remote content recognition service. In one example, by plugging the system 100 into a car radio (e.g., a USB port of the car radio) the listener avoids radio commercials, but may receive offers to buy particular songs from the remote content recognition service or other entity. Such offers may be made over the user interface 110, a user interface of the car radio, a user interface of a cell phone, or other user interface.

A preference module 134 may receive input from the recognition module(s) 132. The input from the recognition module 132 may provide the preference module 134 with a description or indication of content generated in real-time by one or more tuners 128 or description or indication of content within one or more of the buffers 130. The description of the content may include the name of a song within a programming segment, the genre of a song within a programming segment, or that a programming segment is a commercial, or other information. The preference module 134 may use a listener profile 136, 138 (selected based on who the listener is) or a default profile 140 to rank and/or select from among programming segments. The profiles 136, 138 may be stored on a memory device 142. In one example, the preference module 134 may keep track of a user's favorite songs, musical artists, musical genres and/or other information. The listener profiles 136, 138 and/or default profile 140 may include general preferences for programming segments that are not commercial messages.

In one example, the I/O drivers 118 may control the I/O devices 114 in a manner that allows the system 100 to be connected to a USB port of a device, such as a stereo system, car radio, music player, etc. In one example, by connecting the system 100 to car radio or home stereo, the functionality of the system 100 may enhance the operation of the radio, stereo or device to which the system 100 is connected. In this example, the system 100 is essentially a "USB device" that may provide content to the stereo system, car radio, music player, etc. to which it is connected. In a further example, the system 100 is a radio device itself, and may provide audio content to a listener, such as by earphones or speakers 112.

FIG. 2 is a block diagram showing a second example of a structure of a system 200 configured with artificially intelligent control over content selection for playback to a listener. In the example system 200, digital audio content is obtained from multiple radio stations using a radio tuning system 202 that may be software-defined (as shown) or hardware defined. The tuning system 202 may include one or more tuners 204, each of which may be dedicated to tuning a signal from a specific radio station. The tuning system 202 may also include one or more scanning tuners 206, each of which may be configured to tune more than one signal from more than one radio station. That is, the scanning tuners 206 may "scan" from station to station, tuning a signal broadcast by each. Each tuner 204 may be associated with a buffer 208. Additionally, each scanning tuner 206 may be associated with one or more buffers 208 (e.g., one buffer for each radio station tuned by the scanning tuner). The buffer(s) may be defined in one or more memory devices.

Figure 3A:
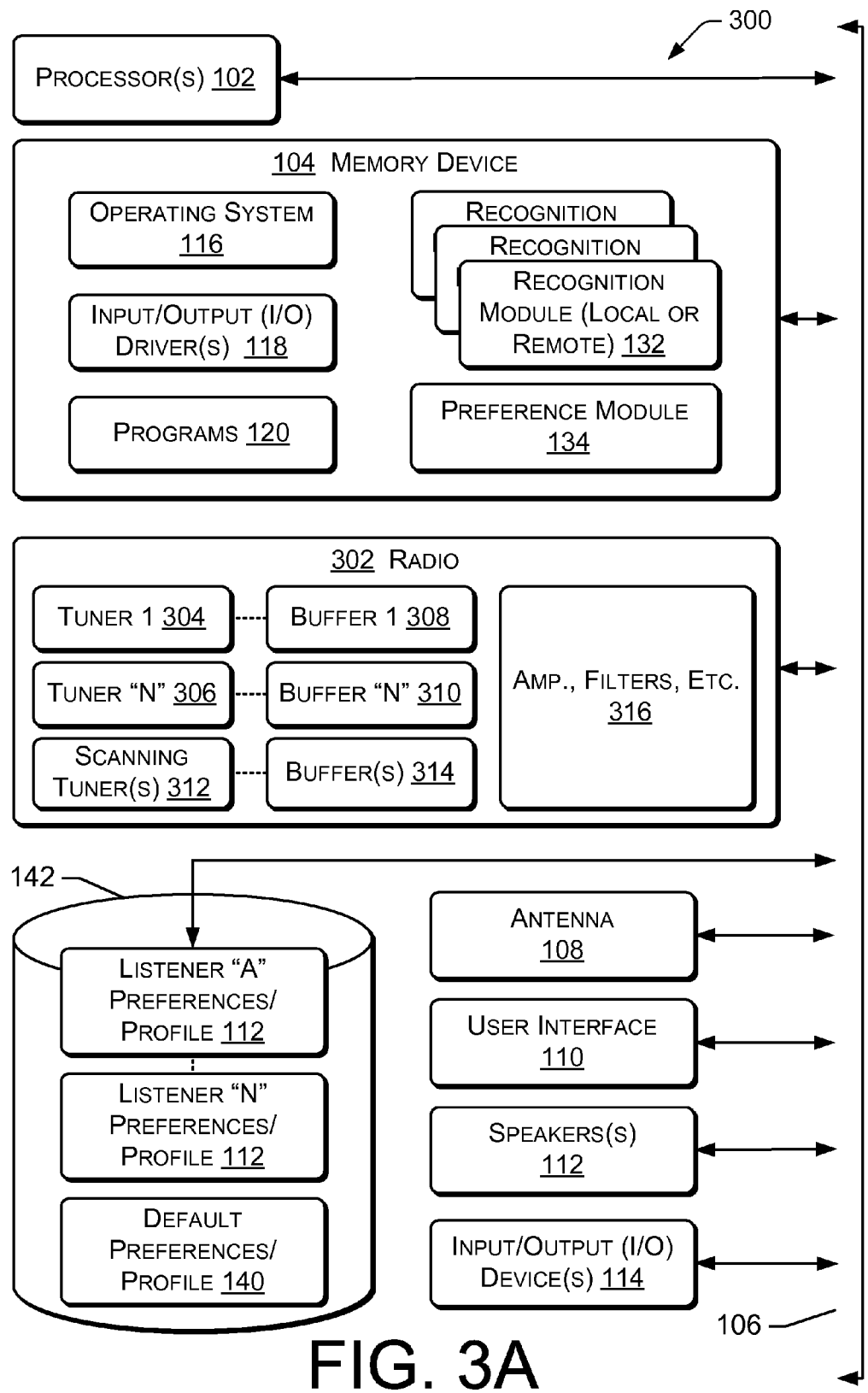
FIG. 3A is a block diagram showing a third example of a structure of a radio receiver, wherein programming information is obtained from multiple radio stations using one or more hardware-defined tuners and optionally one or more scanning tuners.

FIG. 3 is a block diagram showing a third example of a structure of a system 300 configured with artificially intelligent control over frequency selection. In the example shown, programming information is obtained from multiple radio stations using one or more hardware-defined tuners 304, 306 and/or one or more scanning tuners 312. Tuners 304, 306 are representative of "N" tuners that may be configured to tune N radio stations. While more tuners may be desirable, the cost of the system 300 may increase with each additional tuner. Each of the tuners 304, 306, 312 may be associated with a buffer 308, 310, 314. The buffers 308, 310, 314 may be defined in the same or different memory devices, as indicated by design requirements of a particular system. If the output of one or more tuners is buffered, buffered programming segments (e.g., songs) may be recognized or identified (e.g., by the recognition module 132) and listener preferences from among the buffered and recognized programming segments identified (e.g., by the preference module 134).

One or more scanning tuners 312 may be configured to tune radio transmissions from two or more stations. Buffers 314 are configured to receive tuned data from each scanner, which may be organized according to broadcast stations, time or receipt, or other factor(s). Amplifiers, filters and other radio components 316 may be provided as needed.

The systems 100, 200, 300 of FIGS. 1-3 may be stand-alone units or may plug into, or otherwise operate with, another device. In an example of the former, a system 100 may be configured as, or as part of, a radio, car radio, MP3 player, stereo or other device. In an example of the latter, the system 100 may plug into the USB or Aux. port of a stereo, TV, car radio, computer, laptop, tablet, etc. Once plugged into the device, the system may provide content that is "played" through the host device. In an example, the system 100 may be plugged into a USB port of a car radio. In this example, a cable extending from the system to the USB plug may act as an antenna, if desired. The user interface or display device of the car stereo may act as an extension of the user interface 110 of the system 100. Thus, if a listener hears a favorite song, for example, the listener may be able to purchase the song according to known retail channels (e.g., Amazon. com).

Figure 3B:
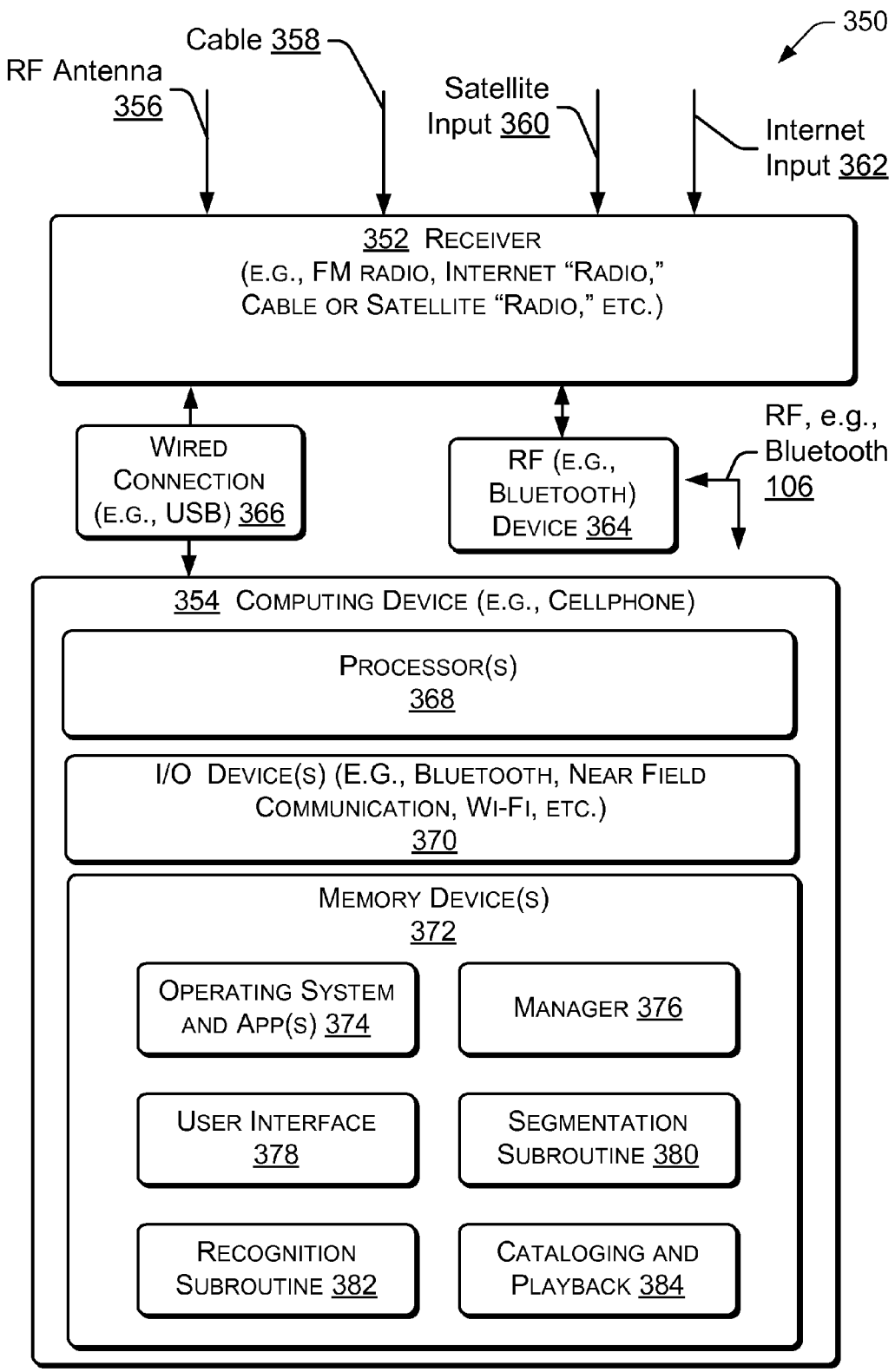
FIG. 3B is a block diagram showing an example system configured to receive content, such as musical songs, to segment the received content into individual songs, to recognize the songs (e.g., by song title and artist), to annotate the received songs according to the recognition, and to store the songs in a file system defined in a memory device.

FIG. 3B shows an example system 350 configured to receive content, segment the content, recognize and annotate the segmented content, and store the content for later playback. The content may be audio, video, or audio/video. In the example shown, audio content may includes musical songs. The songs are received by the system in a stream, which may be segmented into individual songs. A recognition process may be performed as each song is received, or after it is received. The recognition process recognizes song, such as by song title, album, artist, musical genre, etc. Once recognized, the song may be annotated with metadata according to the recognition. The annotated songs may be stored, such as in a file system defined in a memory device.

A receiver 352 may obtain audio content, and transmit that content to a computing device 354 for segmentation, recognition, annotation, storage and later playback. The receiver 352 may be a radio or stereo device, which receives content from a radio frequency antenna 356, a cable (e.g., cable TV), a satellite input (e.g., satellite TV) and/or an Internet input (e.g., Wi-Fi or Ethernet). The receiver may tune or otherwise obtain audio content, such as an audio signal. The audio content may be transmitted to a computing device by means of an RF or wired connection. In a first example, an RF transmitter or transceiver, such as Bluetooth device 364, may be configured to transmit audio content to a computing device. In a second example, a wired connection 366 may be used to transmit audio content, such as over a universal serial bus (USB) connection.

The computing device 354 may be a laptop, tablet, cell phone, a dedicated music acquisition and storage device, etc. The techniques performed by the manager 376, user interface 378, the segmentation subroutine 380, the recognition subroutine 382 and/or the cataloging and playback subroutines 384 may be consolidated and/or reorganized into a greater or lesser number of subroutines, as indicated by design choices.

The computing device may have one or more processors 368 in communication with one or more I/O devices 370, such as a Bluetooth transceiver, a Wi-Fi device, a near field communication (NFC) device, etc. In the example shown, the receiver 352 uses a Bluetooth device 364 to communicate with a cell phone, and to thereby send a content stream (e.g., a sequence of songs) to the computing device.

One or more memory devices 372 are in communication with the one or more processors 368. The memory devices 372 may be RAM, flash, disk, etc., or a combination of these. An operating system and various applications 374 may be contained in the memory device.

As a representative technique of performing the techniques described herein, a manager 376 may be configured to direct operation of a user interface 378. The manager 376 may also be configured to coordinate content reception, segmentation, recognition, annotation, storage, and/or playback functionality.

The user interface 378 may allow the user to select desired content for the manager to acquire, to display indications of content already acquired, to manage content storage and to manage content playback. Thus, the user interface 378 may allow the user to express a musical wish list, such as by genre, artist, etc. The user interface 378 may therefore receive an indication from the user of which songs should later be stored. Later, when the content is available, the user interface provides controls to allow the user to play back any desired content.

The user interface 378 is described in an example form, and may be configured in other manners, as desired for aesthetics, consistency and/or other factors.

The segmentation subroutine 380 is configured to segment in-coming data into to thereby separate desired individual songs from talk, commercials, undesired songs, etc. Accordingly, the segmenting discards content of no interest to a user. The segmentation subroutine 380 may call upon the recognition subroutine 382. Thus, as content arrives from the receiver 352, the segmentation subroutine 380 and the recognition subroutine 382 may determine what song is currently being received. This knowledge helps to determine a start and an endpoint in the content stream for that song. That is, once the song is recognized, buffered data that is part of the song may be determined. The beginning and end of the song may be separated by a known numbers of seconds, and which may be estimated or known based on the point of recognition and/or other factors. The recognition subroutine 382 may utilize technology known technology such as Shazam, to perform the recognition. Accordingly, the recognizing may provide information that assists with the segmenting.

A cataloging and playback subroutine 384 may be configured to store and retrieve the recognized and segmented songs. The songs may be stored with annotations or other metadata, or according to annotations or metadata. For example, the annotations may be used in a directory or file system to allow acquisition of the song data when desired by the user. In one example, annotating the segmented songs includes associating a song title and artist with a song.

Accordingly, the system 350 of FIG. 3B shows an example by which a receiver (e.g., an FM stereo with a headphone jack) can be connected to a Bluetooth transmitter (e.g., at the headphone jack). The Bluetooth signal may be received by a cell phone. The cell phone may segment the incoming signal to separate songs. The songs may be recognized such as by use of Shazam or other technology. Once recognized, metadata may be applied to the data defining the song. The recognition process may be performed in concert with the segmentation process, because knowledge of the song's identify may clarify locations of the start and end of song. Once segmented, recognized and annotated, songs may be stored for later playback or transfer to another device.

Example Buffer Management

Figure 4:
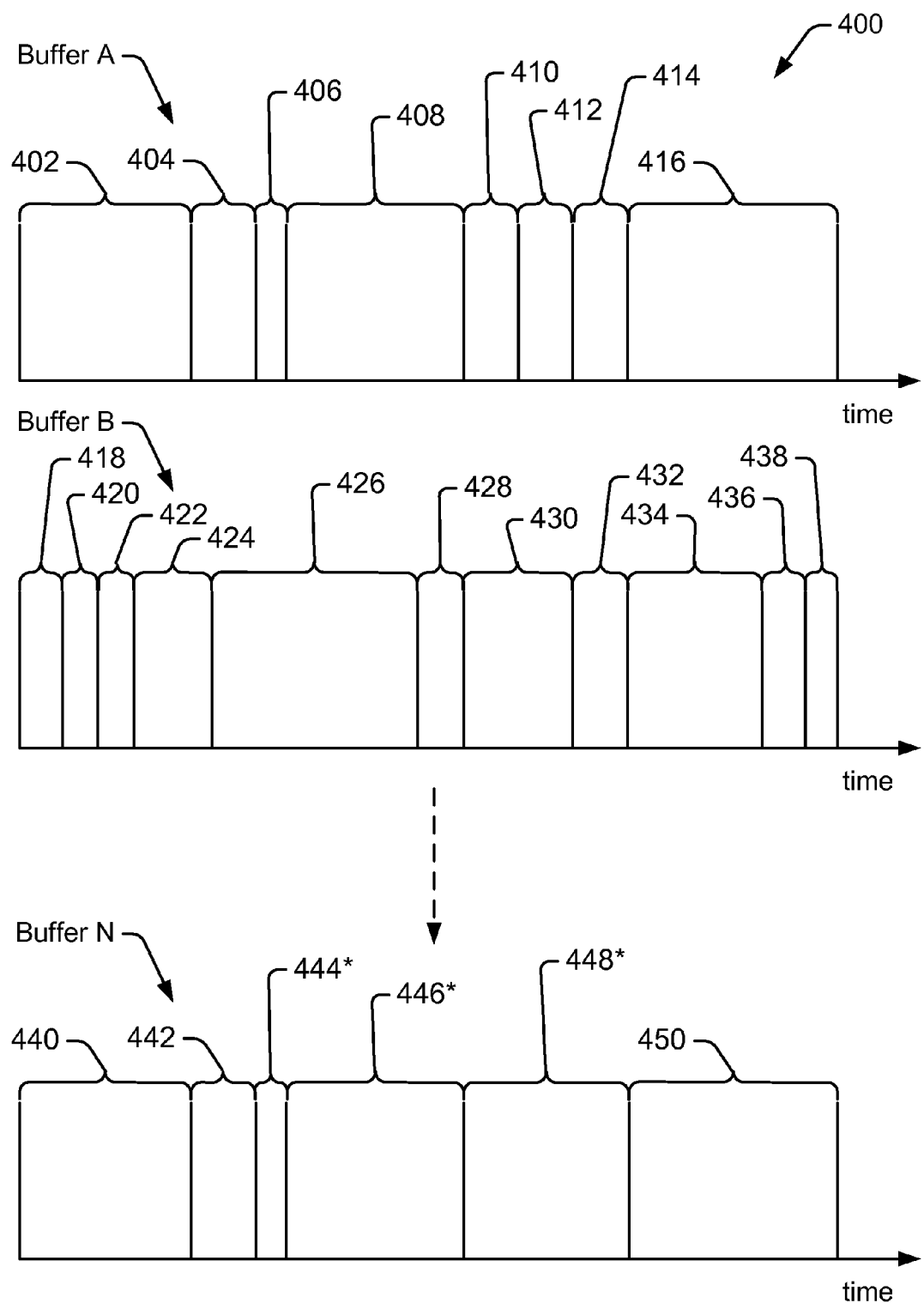
FIG. 4 is a schematic diagram showing example configuration of buffers 1, 2 . . . N. In one example, digital audio data representing the last 10 minutes of programming in each of N radio stations may be contained within one of N respective buffers (which may be defined in one or more memory devices). Thus, each buffer may contain audio recording of commercials, songs, talk, etc. Different songs, talk, commercials and/or other content within the buffers may be segmented or otherwise defined into programming segments (e.g., specific songs), which may be identified for possible playback to a listener.

FIG. 4 is a block diagram showing example configuration of buffers 1, 2 . . . N. In one example, audio data representing a period of time (e.g., 10 to 60 minutes) of programming in each of N radio stations may be contained within a respective buffer. Thus, each buffer may contain digital audio data recording(s) of commercials, songs, talk, etc. that were broadcast by a station during a period of time. Different songs, commercials and other content may be segmented into respective program elements, which may be identified for possible playback to a listener.

Buffer "A" may contain digital audio data content from a particular tuner (e.g., a Tuner "A" in a particular system). In some examples, metadata may also be contained in Buffer "A." Buffer A may contain a number of programming segments 402 through 416. In one example, a recognition module in the system may have recognized transitions between content segments, which may be transitions between different songs or transitions between a song and a commercial, etc. Additionally, the recognition module may have recognized particular songs from among the programming segments 402-416. In the example shown, programming segment 402 may be recognized as the song "Start Me Up," while programming segment 404 may be recognized as a commercial of unknown particulars. Programming segment 406 may be recognized as disk jockey talk, or may be categorized as unknown or undefined. Programming segment 408 may be recognized as the song "Sultans of Swing," and other programming segments may be similarly recognized.

Buffer "B" may contain digital audio content from a particular tuner (e.g., a Tuner "B" in a particular system). In a manner similar to Buffer "A," Buffer "B" includes a number of programming segments 418-438 that may have been recognized by a recognition module. Note that the recognition module may recognize either the content in one or more programming segments or may recognize at transition between two programming segments, or both. Note also that the number of programming segments in different buffers is not necessarily the same, the transition times between segments are not necessarily the same, and lengths of different programming segments is not necessarily the same.

Buffer "N" is similarly configured with programming segments 440 through 450. Note that programming segments 444 through 448 have an asterisk to indicate that the recognition module is uncertain about the divisions between these segments and/or the content within these segments. Accordingly, it is less likely that these programming segments will be selected by a preference module for presentation to a listener.

While all of the buffers A, B . . . N have been shown to be of a similar length, in some applications it may be beneficial to have buffers of different length. In one example, buffers configured to buffer programming segments associated with a listener's preferred two or three radio stations may be longer (i.e., contain more minutes of recorded programming and/or more recorded programming segments) than other buffers associated with less favorite radio stations. In one example, a listener whose taste runs to soft rock may utilize longer buffers associated with two or three soft rock stations. However, if the listener has an interest in popular country music, shorter buffers associated with country stations may be appropriate, so that programming segments of pop country or cross-over country hits may be created.

The buffers A, B . . . N may have persistent memory, in that if the system 100, 200 or 300 is turned off, fully formed programming segments may persist until the system is turned on again. In an example, if the system 100 is operationally plugged into the USB port of a car radio/stereo, and the car and the system are turned off, the buffers in the system may continue to contain digital audio data. Thus, when the car, the car radio and the system 100 turned on again, the system may provide the listener with a song (e.g., beginning at the beginning of the song), which was still in the buffer as a result of previous operation.

Example Methods

In some examples of the techniques discusses herein, the methods of operation may be performed by one or more application specific integrated circuits (ASIC) or may be performed by a general purpose processor utilizing software defined in memory. In the examples and techniques discussed herein, the memory 104 may comprise computer-readable media and may take the form of volatile memory, such as random access memory (RAM) and/or non-volatile memory, such as read only memory (ROM) or flash RAM. Computer-readable media includes non-transitory, volatile and non-volatile, removable and non-removable media implemented in any method or technology for storage of information such as computer-readable instructions, data structures, program modules, or other data for execution by one or more processors of a computing device. Examples of computer-readable media include, but are not limited to, phase change memory (PRAM), static random-access memory (SRAM), dynamic random-access memory (DRAM), other types of random access memory (RAM), read-only memory (ROM), electrically erasable programmable read-only memory (EEPROM), flash memory or other memory technology, compact disk read-only memory (CD-ROM), digital versatile disks (DVD) or other optical storage, magnetic cassettes, magnetic tape, magnetic disk storage or other magnetic storage devices, or any other non-transmission medium that can be used to store information for access by a computing device. As defined herein, computer-readable media does not include transitory media, such as modulated data signals, carrier waves and transitory signals.

FIGS. 5-8 are flow diagrams showing an example processes which are representative of techniques for use in providing content to a listener. The techniques may include some or all of the following tuning a plurality of radio stations simultaneously; buffering digital audio data obtained from the tuning; segmenting and/or recognizing at least some of the digital audio content in the buffer(s) into segments of known programming (e.g., songs identified by title and artist); determining programming of interest to a listener from among recognized programming segments; and, providing at least some of the programming segments to the listener. The processes may, but need not necessarily, be implemented in whole or in part by techniques discussed with respect to the systems 100, 200 and/or 300. Moreover, the processes are described with references to the systems 100, 200 and/or 300 for ease of understanding, but are not limited to performance with these systems. Accordingly, the systems 100, 200 and/or 300 are capable of performing numerous other processes and the processes of FIGS. 5-8 may be implemented using numerous other systems.

Figure 5:
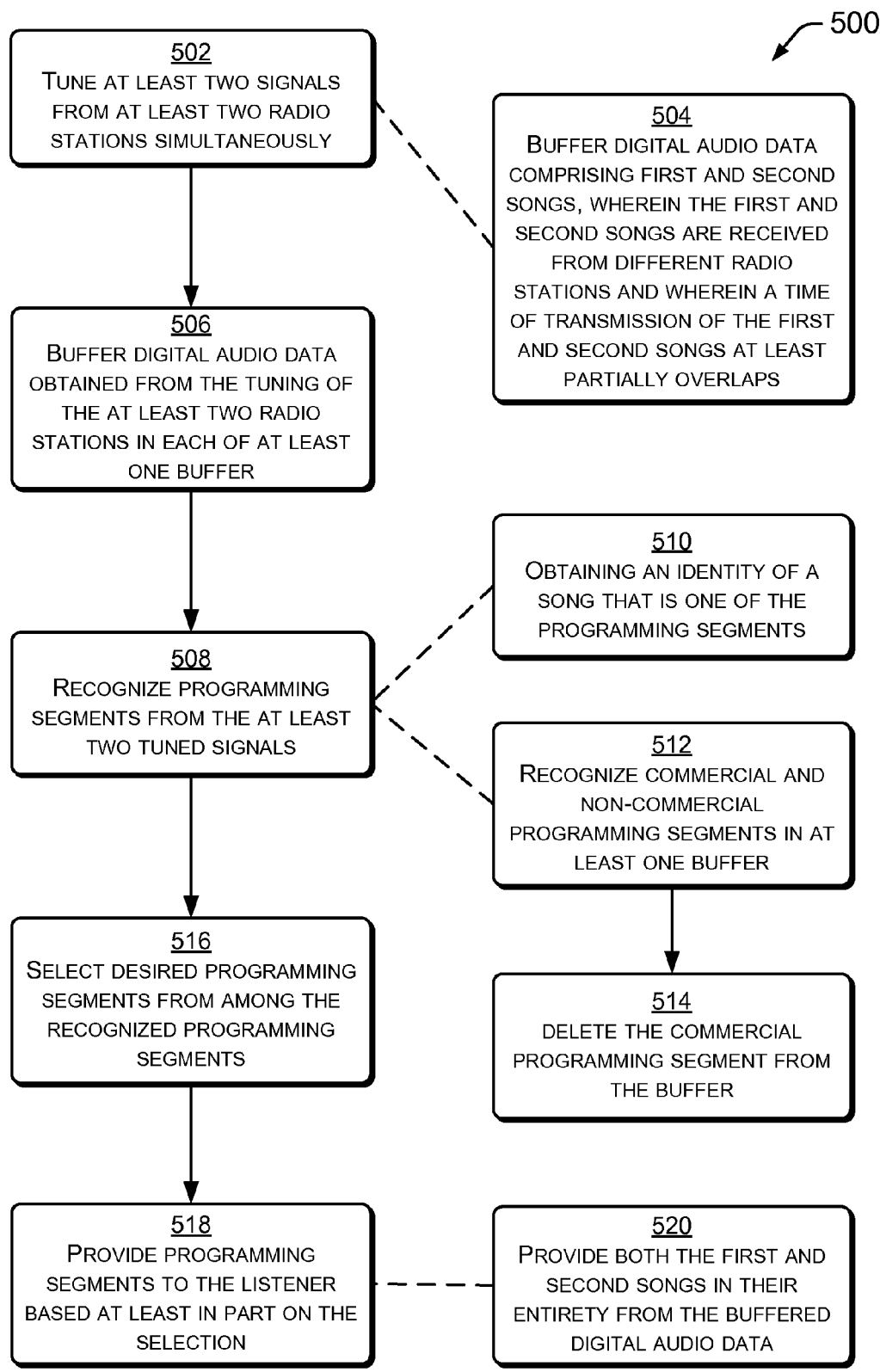
FIG. 5 is a flow diagram showing a first example method by which radio signals may be tuned simultaneously, resulting digital audio data buffered, transitions in programming detected (e.g., within the buffers), information about specific programming segments obtained and analyzed (e.g., song, by title and artist), and programming segments (e.g., songs) provided to a listener based at least in part on the obtained and analyzed information.

FIG. 5 is a flow diagram showing a first example method 500 by which radio signals may be tuned. In the example, some or all of the content from the tuned radio signals may be buffered. Recognition module(s) may analyze content within buffer(s), to determine transitions between programming segments (i.e., define programming segments) and identities and/or categories of content within the programming segments. Once the content within at least some of the programming segments is recognized, the recognized content may be analyzed to identify desired programming (e.g., favorite songs) and provided to a listener.

At block 502, at least two signals, from at least two radio stations, are tuned simultaneously. In the context of the example of FIG. 1, each of a plurality of tuners 128 may tune one of a plurality of signals from a plurality of respective radio stations. By tuning signals from a plurality of radio stations, alternative programming segments may be obtained for presentation to a listener.

Block 504 shows example/alternative detail of the techniques of block 502. In the example, digital audio data comprising at least first and second songs is buffered. The first and second songs may be received from different radio stations and transmission times of the first and second songs may at least partially overlap. However according to the described techniques, despite the overlap in time and the transmission of the songs over different radio stations, both songs may be provided (played-back) to the listener in their entireties.

At block 506, digital audio data obtained from the tuning of the at least two radio stations may be buffered in each of at least one buffer, which may be defined in one or more memory devices. In the context of the example of FIG. 1, each tuner 128 may be associated with a buffer 130, so that digital audio data from the tuners is saved into the buffers. Each buffer may be able to save data for a period of time, such as 10 to 60 minutes, or more, before older data is overwritten by newer data.

At block 508 programming segments from the at least two tuned signals are recognized. The programming segments may be received from buffers (as indicated by block 506) or streaming directly from a tuner. The recognition process may include a two-step process. First, the recognition of programming segments and/or the transition between different programming segments may be performed. Thus, transitions between a song and a commercial, or one song and another song are recognized. Thus, data ranges of at least some programming segments are discovered. Second, the identity of at least some of the programming segments is discovered. In the example, an identity of a song is recognized in one of the plurality of programming segments.

Block 510 shows one example implementation of block 508. In this example, an identity of a song that is one of the programming segments is obtained. The song may be recognized by artist, album and/or title, or more generally as being "music" as opposed to a commercial message. In the context of the example of FIG. 1, the recognition module 132 may recognize a plurality of programming segments. The content from which the programming segments are distinguished may be obtained directly from one or more tuners 128 or from one or more buffers 130. A compound recognition module 132, with a plurality of recognition processes operating, may recognize programming segments in each of a plurality of buffers, respectively.

Blocks 512-514 shows one example implementation of block 508. At block 512, commercial and non-commercial programming segments are recognized and/or distinguished from each other. The programming segments may be in one or more buffer(s). At block 514, the commercial programming segments (i.e., commercials or advertisements) are deleted from the buffer(s). Such deletion frees up space on the buffer(s) and allows programming segments of greater value to the listener to be buffered in the freed space.

At block 516, desired programming segments are selected from among the recognized programming segments in the buffer(s). In the context of the example of FIG. 1, the programming segments are analyzed by the preferences module 134. In one example, the selection process (e.g., performed by a preference module, listener profile, etc.) may select music over commercials, particular genres of music over other genres, programming from particular stations over programming from other stations, particular songs over other particular songs, particular singers/groups/artists over other particular singers/groups/artists.

At block 518, programming segments are provided to the listener. In the example shown, the segments are determined at least in response to the recognition of content in different programming segments (block 508), and the selection of preferred programming content and programming segments (block 516). In the context of the example of FIG. 1, I/O drivers 118 and/or I/O devices 114 may be used to provide the programming segments. In one example, if the system 100 is plugged into a USB port in a car radio, the program segments will play through the car radio.

Block 520 shows example detail of the techniques of block 518. In the example, first and second songs are provided, such as from buffered data. Use of buffered data allows both songs to be provided to the listener in their entirety, even though time of transmission time of the first and second songs may have overlapped at least in part, and the transmission of the songs may have been by different radio stations.

Figure 6:
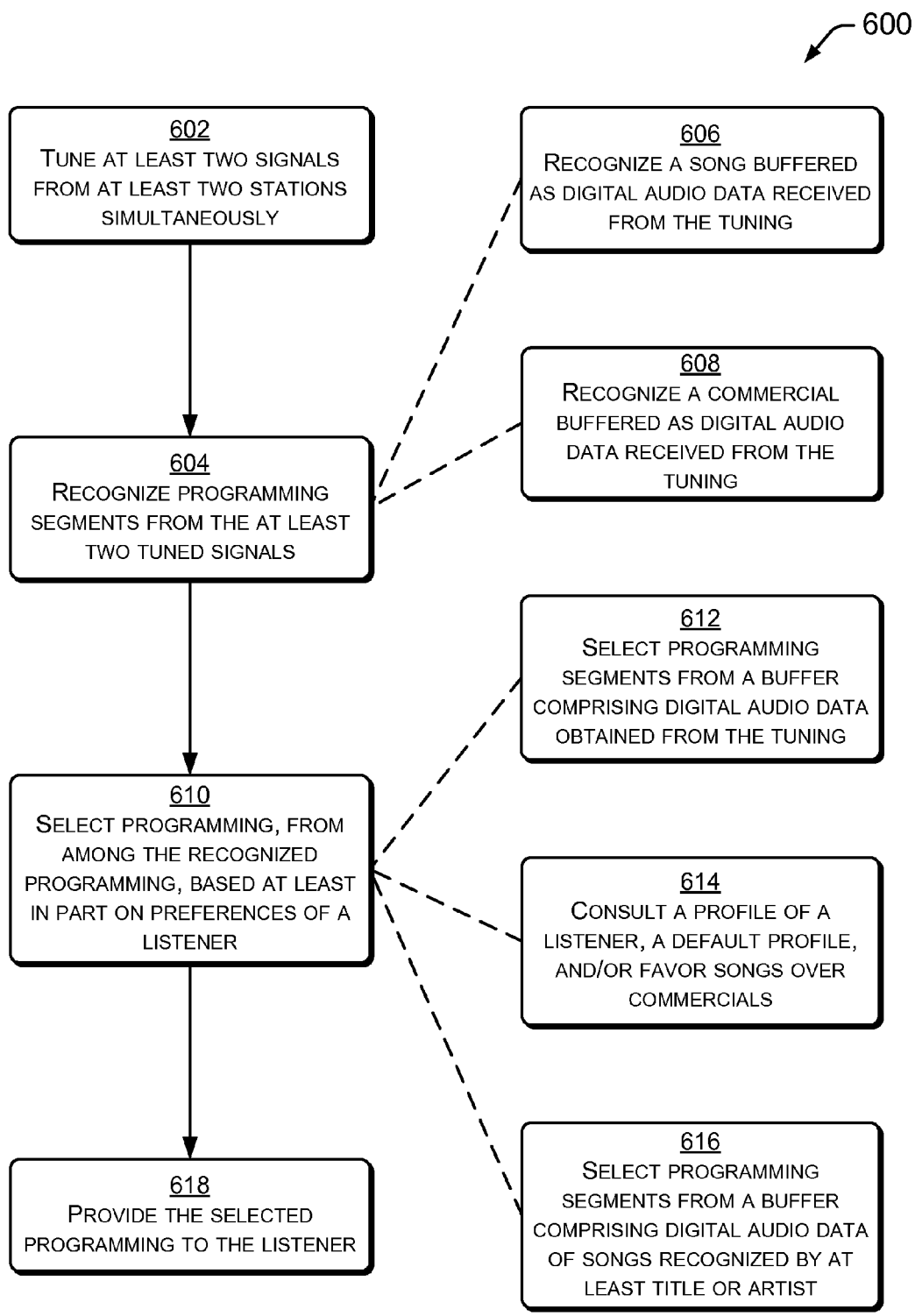
FIG. 6 is a flow diagram showing a second example method by which radio programming from multiple stations may be simultaneously tuned, buffered, programming segments located within buffer(s) and recognized (song, commercial, talk, etc.), and programming segments consistent with a listener's preferences selected and provided.

FIG. 6 is a flow diagram showing a second example method 600 by which radio programming from multiple stations may be simultaneously tuned, digital audio content buffered, programming segments recognized, and recognized programming segments consistent with a listener's preferences selected and provided.

At block 602, at least two signals from at least two stations are tuned simultaneously. In the example of FIG. 1, a plurality of tuners 128 may be utilized to tune a plurality of radio stations, including AM, FM, satellite and other radio stations. By tuning a plurality of radio stations, programming of greater interest to the listener is more likely to be tuned. The output of the tuning process may include digital audio data, metadata or other information, and may result in a digital audio data stream, buffered digital audio data and/or digital audio data files.

At block 604, programming segments from the at least two tuned signals is recognized. Recognizing the programming may comprise recognizing content in data of a digital audio data stream, digital audio data buffered in memory and/or digital audio data configured in files (e.g., of a file system defined in part by an operating system). Additionally or alternatively, recognized the programming may comprise utilizing metadata, which may describe aspects of the programming Blocks 606 and 608 show example/alternative detail of the techniques of block 604. At block 606, a song buffered as digital audio data, which was received from the tuning, is recognized. At block 608, a commercial buffered as digital audio data received from the tuning is recognized. Blocks 606, 608 may be performed by content recognition systems that are either based on the system 100, 200, 300 or accessed over the Internet. The recognition functionality of blocks 606, 608 provides input for the section process of block 610.

At block 610, programming, from among the recognized programming, is selected. The selection may be of particular programming segments and may be based at least in part on preferences of a listener. In the context of the examples of FIGS. 1-3, the preferences module 134 may consult listener preferences or a default profile to identify and/or select programming of interest to the listener. Blocks 612, 614 and 616 show example/alternative detail of the techniques of block 610. In the example of block 612, programming segments may be selected from a buffer comprising digital audio data obtained from the tuning (e.g., block 602) and recognized a recognition module (e.g., at block 604). In one example, the information regarding the recognized programming may be input to an artificial intelligence algorithm. Such an algorithm may access user profiles, default data, or rules-based analysis to determine programming of interest to the listener. In the example of block 614, techniques to identify programming acceptable to the listener may access one or more listener profile(s) including listener preferences, likes, dislikes, etc. In the example of block 616, programming segments are selected from a buffer comprising digital audio data of songs recognized, such as by title and/or artist.

At block 618, programming is provided to the listener based at least in part on the tuning signal and digital audio data obtained at block 602, the recognition of programming segments and associated content at block 604, and the selection of preferred programming segments at block 610.

Figure 7:
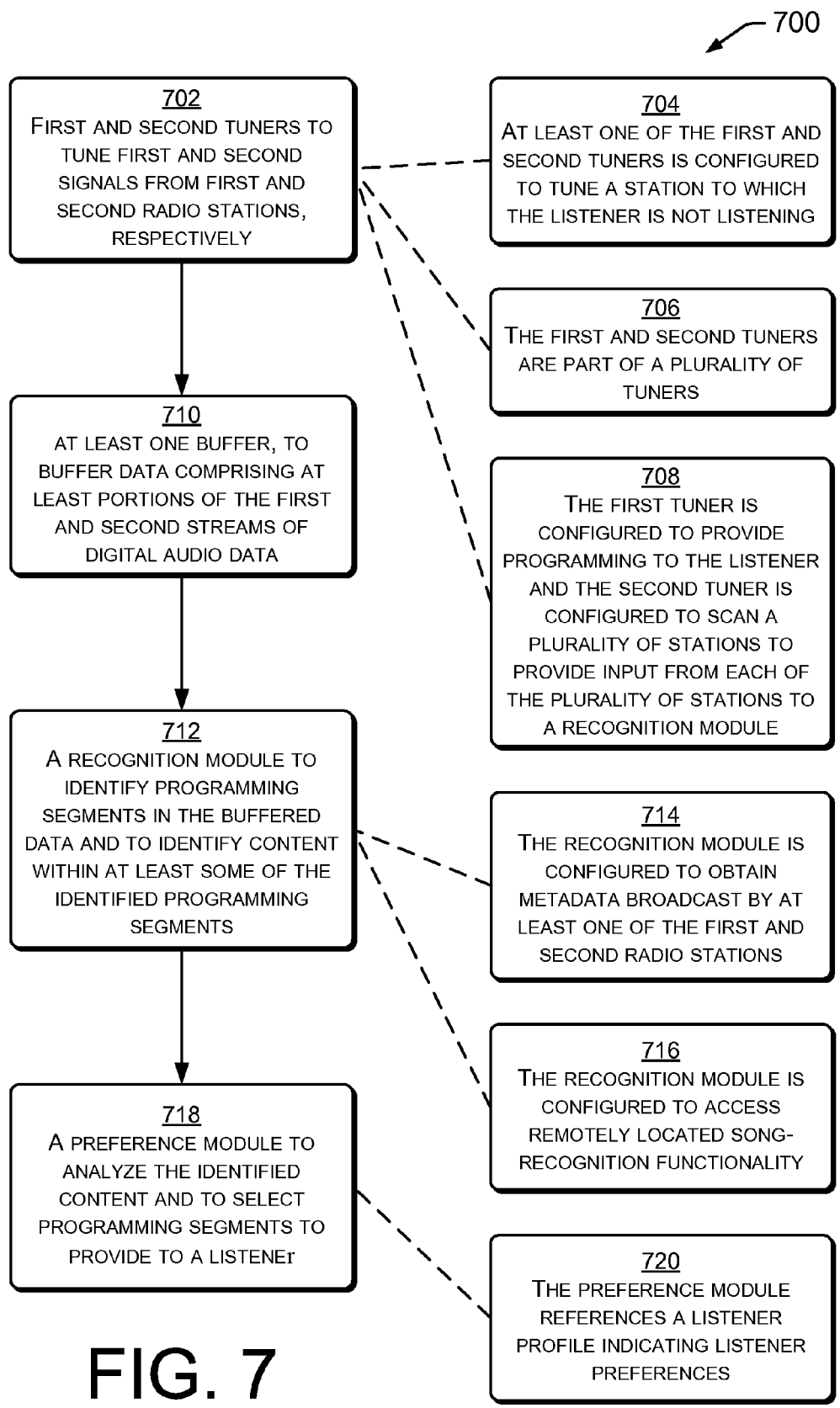
FIG. 7 is a flow diagram showing a third example method by which various hardware and/or software components may operate to provide preferred programming (e.g., preferred songs) to a listener.

FIG. 7 is a flow diagram showing a third example method 700, illustrating how various hardware and/or software components may operate to provide preferred programming (e.g., preferred songs and no commercials) to a listener.

At block 702, first and second tuners to tune first and second signals from first and second radio stations, respectively. In the context of the example of FIGS. 1-3, tuners 128 may be configured to tune any set of desired radio stations. The tuners input radio frequency signals (e.g., obtained from one or more antennas) and output digital audio data, metadata, etc., in the form of a stream, buffer, data file, etc. Blocks 704, 706 and 708 show example/alternative detail of the techniques of block 702. At block 704, at least one of the first and second tuners is configured to tune a station to which the listener is not listening. By tuning a station to which the listener is not listening, additional options for the listener are obtain, which a listener is unable to otherwise obtain (i.e., it is impractical to listen to two radio stations at the same time). At block 706, the first and second tuners are part of a plurality of tuners. In the context of the example of FIGS. 1-3, a plurality of tuners may be provided. By providing a plurality of tuners, and by buffering (for example) 10 to 60 minutes of programming from each, the system is able to consider a large number of listening options for the user. In the example of block 708, one tuner is configured to provide programming to the listener (e.g., in real time and/or without buffering) and a second tuner is configured to scan a plurality of stations and to provide input from each of the plurality of stations to a recognition module. Accordingly, the second tuner can actively look for programming options and/or alternatives to the first tuner.

At block 710, at least one buffer is configured to receive and buffer data comprising at least portions of the first and second streams of digital audio data, which may be received from the first and second tuners, respectively. In one example, the buffers may be configured to overwrite older data as needed. Additionally, if commercial programming segments are identified, the buffer may rearrange data to overwrite such segments before their chronological turn.

At block 712, a recognition module identifies programming segments in the buffered data and identifies content within at least some of the identified programming segments. Blocks 714 and 716 show example/alternative detail of the techniques of block 712. At block 714, the recognition module is configured to obtain metadata broadcast by at least one of the first and second radio stations. At block 716, the recognition module is configured to access remotely located song-recognition functionality. In one example, the recognition module may utilize an entity such as Shazam.

At block 718, a preference module may be configured to receive the programming information (e.g., song title and artist) from the recognition module and to determine what programming to provide to a listener. Block 720 shows example/alternative detail of the techniques of block 718. At block 720, the preference module may include a listener profile indicating listener preferences. The listener may actively input the preferences through a listener interface, the preferences may be assumed by listener activity, the preferences may be derived from social media (e.g., the listener's Facebook activity), etc.

Figure 8:
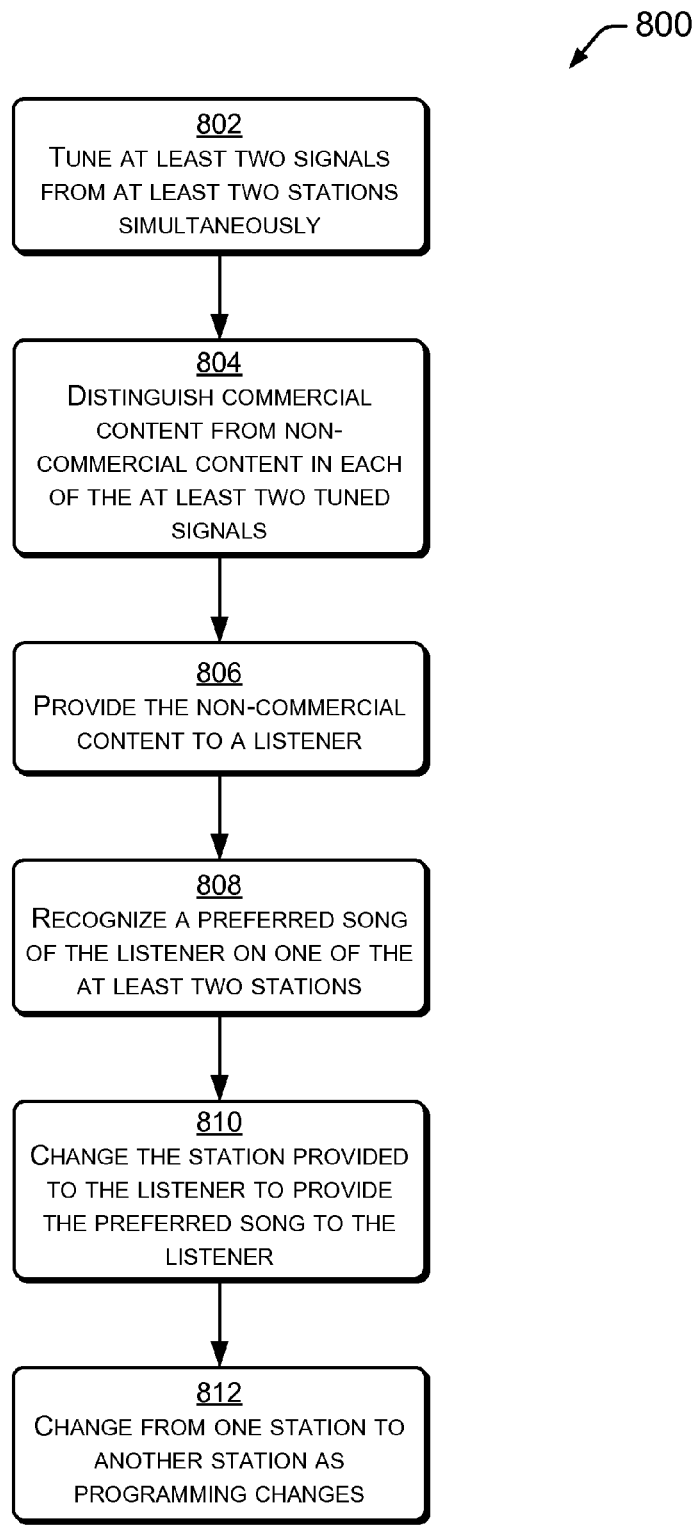
FIG. 8 is a flow diagram showing a fourth example method by which programming may be provided to a listener, in one example by tuning at least two stations simultaneously, distinguishing commercial message content from non-commercial message content, and providing non-commercial message content to a listener.

FIG. 8 is a flow diagram showing a fourth example method 800 by which programming may be provided to a listener (e.g., by tuning at least two stations simultaneously, distinguishing commercial message content from non-commercial message content, and providing non-commercial message content to a listener.

At block 802, at least two signals, from at least two stations, are tuned simultaneously. In the context of the example of FIGS. 1-3, tuners 128 may be used to tune a plurality of radio stations. At block 804, commercial content (i.e., commercials) is distinguished from non-commercial content (e.g., songs) in each of the at least two tuned signals. At block 806, non-commercial content to a listener based at least in part on the distinguishing.

At block 808, a preferred song of the listener may be recognized on one of the at least two stations. At block 810, the station provided to the listener is changed to provide the preferred song to the listener. At block 812, to provide listener-preferred content, the system may change from one station to another station as programming changes over time.

Examples

A method, comprising: tuning at least two signals from at least two radio stations simultaneously; recognizing programming segments from the at least two tuned signals; selecting desired programming segments from among the recognized programming segments; and providing programming segments to a listener based at least in part on the selection.

The method of claim 1, additionally comprising buffering digital audio data obtained from the tuning of the at least two radio stations in each of at least one buffer.

The method of claim 1, additionally comprising: recognizing a commercial programming segment in at least one buffer; and deleting the commercial programming segment from the buffer.

The method of claim 1, wherein recognizing programming segments comprises obtaining an identity of a song that is one of the programming segments.

The method of claim 1, wherein: recognizing programming segments comprises: recognizing commercial programming segments; and recognizing songs; and selecting desired programming segments comprises selecting from among the recognized songs.

The method of claim 1, wherein selecting programming segments is based at least in part on a listener profile.

The method of claim 1, wherein: tuning at least two signals from the at least two radio stations simultaneously comprises buffering digital audio data comprising first and second songs, wherein the first and second songs are received from different radio stations and wherein a time of transmission of the first and second songs at least partially overlaps; and providing programming segments to the listener comprises providing both of the first and second songs from the buffered digital audio data.

One or more computer-readable media storing computer-executable instructions that, when executed, cause one or more processors to perform acts comprising: tuning, simultaneously, at least two signals from at least two radio stations, respectively; recognizing programming associated with the at least two tuned signals; selecting programming, from among the recognized programming, based at least in part on preferences of a listener; and providing the selected programming to the listener.

One or more computer-readable media as recited in claim 8, wherein the recognizing of the programming comprises recognizing a song buffered as digital audio data received from the tuning.

One or more computer-readable media as recited in claim 8, wherein the recognizing of the programming comprises recognizing a commercial buffered as digital audio data received from the tuning One or more computer-readable media as recited in claim 8, wherein selecting programming comprises selecting programming segments from a buffer comprising digital audio data obtained from the tuning One or more computer-readable media as recited in claim 8, wherein the preferences of the listener comprise favoring songs over commercials.

One or more computer-readable media as recited in claim 8, wherein selecting programming comprises selecting programming segments from a buffer comprising digital audio data of songs recognized by at least title or artist.

A radio, comprising: first and second tuners to tune first and second signals from first and second radio stations, respectively, and to generate first and second streams of digital audio data, respectively; at least one buffer, to buffer data comprising at least portions of the first and second streams of digital audio data; a recognition module to identify programming segments in the buffered data and to identify content within at least some of the identified programming segments; and a preference module to select programming segments from among the identified programming segments to provide to a listener.

The radio as recited in claim 14, wherein the first and second tuners are part of a plurality of tuners.

The radio as recited in claim 14, wherein the at least one buffer is part of a plurality of buffers, each to receive digital audio data from a respective tuner.

The radio as recited in claim 14, wherein the recognition module scans the at least one buffer to recognize programming segments comprising songs.

The radio as recited in claim 14, wherein the recognition module obtains metadata broadcast by at least one of the first and second radio stations.

The radio as recited in claim 14, wherein the recognition module accesses remotely-located song-recognition functionality.

The radio as recited in claim 14, wherein the preference module comprises a listener profile indicating listener preferences.

A method, comprising: tuning at least two signals from at least two radio stations simultaneously; distinguishing commercial content from non-commercial content in each of the at least two tuned signals; and providing the non-commercial content to a listener.

The method of claim 21, wherein providing non-commercial content to the listener comprises changing from one radio station to another radio station as programming changes.

The method of claim 21, additionally comprising: recognizing a preferred song of the listener on one of the at least two radio stations; and changing the radio station provided to the listener to provide the preferred song to the listener.

The method of claim 21, additionally comprising: distinguishing between songs played on each of the at least two radio station; and consulting a listener profile to determine which of the songs played would be preferred by the listener.

The method of claim 21, additionally comprising: distinguishing content broadcast by each of the at least two radio stations; and changing from one radio station to another radio station based on the distinguishing.

The method of claim 21, additionally comprising: distinguishing songs broadcast by each of the at least two radio stations; and changing from one radio station to another radio station based on the distinguished songs.

The radio as recited in claim 19, wherein the remotely-located song-recognition functionality comprises an application residing on a mobile device in communication with the radio.

The radio as recited in claim 19, wherein the remotely-located song-recognition functionality comprises a web service accessible by the radio via a wireless network connection.

The method of claim 1, wherein the recognizing programming segments comprises comparing at least a portion of one of the tuned signals with a library of known content items.

The method of claim 1, wherein the recognizing programming segments comprises comparing a hash of at least a portion of one of the tuned signals with a library of hashes of known content items.

The method of claim 1, wherein the selecting desired programming segments from among the recognized programming segments is based at least in part on information stored on a mobile device.

The method of claim 31, further comprising accessing the mobile device to obtain the information.

The method of claim 31, the information comprising information regarding one or more songs stored on the mobile device, one or more podcasts stored on or subscribed to via the mobile device, one or more programs stored on or accessed by the mobile device, one or more internet radio stations accessed by the mobile device, one or more applications installed on the mobile device, one or more songs tagged by the mobile device, and/or one or more websites accessed by the mobile device.

The method of claim 31, further comprising obtaining user preference information from the mobile device One or more computer-readable media storing computer-executable instructions that, when executed, cause one or more processors to perform acts comprising: receiving an incoming signal; recognizing individual songs within the incoming signal; segmenting the individual songs; annotating the segmented songs according to the recognition; and storing the songs based in part on the annotations.

One or more computer-readable media as recited in claim 8, wherein the recognizing provides information that assists the segmenting.

One or more computer-readable media as recited in claim 8, wherein the segmenting discards content of no interest to a user.

One or more computer-readable media as recited in claim 8, wherein a user interface receives an indication of which songs should be stored.

One or more computer-readable media as recited in claim 8, wherein the incoming signal is a Bluetooth or Wi-Fi signal and the receiving, segmenting, annotating and storing are performed by a cell phone.

One or more computer-readable media as recited in claim 8, wherein annotating the segmented songs comprises associating a song title and artist with a song.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims

What is claimed is:

1. A radio device, comprising:
 first and second hardware-defined tuners to tune first and second signals from first and second radio stations, respectively, and to generate first and second streams of digital audio data, respectively;
 one or more antennas, to provide RF signals to the first and second hardware-defined tuners:
 at least one buffer, defined in a memory device, to buffer data comprising at least portions of the first and second streams of digital audio data; and
 one or more processors in communication with the memory device to store a wish list of content and instructions that, when executed by the one or more processors, configure the radio device to:
 buffer the first and second streams of digital audio data in the memory device;
 identify, by operation of a recognition module, programming segments in the buffered data and identify content within at least some of the identified programming segments;

select, by operation of a preference module, desired programming segments from among the identified programming segments based at least in part on the wish list;

delete commercial programming segments from buffer data comprising the portions of the first and second streams of digital audio data;

annotate the desired programming segments based at least in part on the identified content; and store the desired programming segments in the memory device for subsequent playback.

2. The radio device as recited in claim 1, wherein the first and second hardware-defined tuners are part of a plurality of tuners.

3. The radio device as recited in claim 1, wherein the at least one buffer is part of a plurality of buffers, each to receive digital audio data from a respective tuner.

4. The radio device as recited in claim 1, wherein the recognition module scans the at least one buffer to recognize programming segments, and to recognize content, comprising songs, within the recognized programming segments.

5. The radio device as recited in claim 1, wherein the recognition module obtains metadata broadcast by at least one of the first and second radio stations.

6. The radio device as recited in claim 1, wherein the recognition module accesses remotely-located song-recognition functionality.

7. The radio device as recited in claim 1, wherein the preference module comprises a listener profile indicating listener preferences.

8. A radio device, comprising:

first and second tuners, defined in one or more integrated circuits, to tune first and second signals from first and second radio stations, respectively, and to generate first and second streams of digital audio data, respectively;

one or more antennas, to provide an RF signal to the first and second tuners;

at least one buffer, defined in a memory device, to buffer data comprising at least portions of the first and second streams of digital audio data; and one or more processors, defined in the one or more integrated circuits and in communication with the memory device, to store a wish list of content and instructions that, when executed by the one or more processors, configure the radio device to:

buffer the first and second streams of digital audio data in the memory device;

identify, by operation of a recognition module, programming segments in the buffered data and identify content within at least some of the identified programming segments;

select, by operation of a preference module, desired programming segments from among the identified programming segments based at least in part on the wish list;

delete commercial programming segments from buffer data;

annotate the desired programming segments based at least in part on the identified content; and store the desired programming segments in the memory device for subsequent playback.

9. The radio device as recited in claim 8, wherein the first and second tuners are part of a plurality of tuners.

10. The radio device as recited in claim 8, wherein the at least one buffer is part of a plurality of buffers, each to receive digital audio data from a respective tuner.

11. The radio device as recited in claim 8, wherein the recognition module scans the at least one buffer to recognize programming segments, and to recognize content, comprising songs, within the recognized programming segments.

12. The radio device as recited in claim 8, wherein the recognition module obtains metadata broadcast by at least one of the first and second radio stations.

13. The radio device as recited in claim 8, wherein the recognition module accesses remotely-located song-recognition functionality.

14. The radio device as recited in claim 8, wherein the preference module comprises a listener profile indicating listener preferences.

15. A radio device, comprising:

first and second tuners, defined in one or more application specific integrated circuits, to tune first and second signals from first and second radio stations, respectively, and to generate first and second streams of digital audio data, respectively;

one or more antennas, to provide an RF signal to the first and second tuners;

at least one buffer, defined in a memory device, to buffer data comprising at least portions of the first and second streams of digital audio data; and one or more processors, defined in the one or more application specific integrated circuits and in communication with the memory device, to store a wish list of content and instructions that, when executed by the one or more processors, configure the radio device to:

buffer the first and second streams of digital audio data in the memory device;

identify, by operation of a recognition module, programming segments in the buffered data and identify content within at least some of the identified programming segments;

select, by operation of a preference module, desired programming segments from among the identified programming segments based at least in part on the wish list;

delete commercial programming segments from buffer data;

annotate the desired programming segments based at least in part on the identified content; and store the desired programming segments in the memory device for subsequent playback.

16. The radio device as recited in claim 15, wherein the at least one buffer is part of a plurality of buffers, each to receive digital audio data from a respective tuner.

17. The radio device as recited in claim 15, wherein the recognition module scans the at least one buffer to recognize programming segments, and to recognize content, comprising songs, within the recognized programming segments.

18. The radio device as recited in claim 15, wherein the recognition module obtains metadata broadcast by at least one of the first and second radio stations.

19. The radio device as recited in claim 15, wherein the recognition module accesses remotely-located song-recognition functionality.

20. The radio device as recited in claim 15, wherein the preference module comprises a listener profile indicating listener preferences.

* * * * *